United States Patent [19]

Kub

[11] 4,131,902

[45] Dec. 26, 1978

[54] BIPOLAR TRANSISTOR WITH A DUAL-DIELECTRIC TUNNEL EMITTER

[75] Inventor: Francis J. Kub, Pasadena, Md.

[73] Assignee: Westinghouse Electric Corp., Pittsburgh, Pa.

[21] Appl. No.: 838,261

[22] Filed: Sep. 30, 1977

[51] Int. Cl.$^2$ .................................... H01L 49/02
[52] U.S. Cl. .................................... 357/6; 357/23; 357/52; 357/54; 357/34
[58] Field of Search .................... 357/6, 54, 23, 52, 34

[56] References Cited

U.S. PATENT DOCUMENTS

| | | | |
|---|---|---|---|
| 3,060,327 | 10/1962 | Dacey | 307/88.5 |
| 3,831,185 | 8/1974 | Kroger et al. | 357/6 |
| 3,831,186 | 8/1974 | Kroger | 357/6 |
| 3,979,613 | 9/1976 | Kroger et al. | 307/304 |
| 4,042,945 | 8/1977 | Lin et al. | 357/23 |

OTHER PUBLICATIONS

Weinberg, *Appl. Phys. Lett.*, vol. 27, No. 8, 15 Oct. 75, p. 437 et seq.
Weinberg, *Appl. Phys. Lett.*, vol. 29, No. 9, 1 Nov. 76, p. 6 & 7 et seq.
Uchida et al., *I.E.E.E. Trans. on Electron Devices*, vol. C-D-24, No. 6, Jun. 77, p. 688 et seq.

*Primary Examiner*—Martin H. Edlow
*Attorney, Agent, or Firm*—W. E. Zitelli

[57] ABSTRACT

A dual-dielectric emitter bipolar transistor device is disclosed. Two dielectric layers are deposited over the base region of a base-collector junction and are used to emulate an emitter of a conventional bipolar transistor. The transistor device obtained thereby provides for a compatible technology to easily incorporate bipolar transistors with CMOS, MNOS, and CCD structures. Preferably, the first of the two dielectric layers which is in contact with the base region is made from $SiO_2$ and has a thickness of substantially less than 30Å. The second of the two layers which sandwiches the first layer between itself and the base region may be made from a silicon-nitride compound, preferably having substantially equal proportions of silicon and nitrogen and a thickness dimension ranging from 50 to 500Å. Means are provided for application of a bias voltage potential of such polarity to inject minority carriers into the base from the emitter across the emitter-base junction and also a sufficient reverse bias voltage potential across the base-collector junction. At suitably chosen forward biased voltage potentials applied across the dual-dielectric emitter junction, minority carriers are injected across the dielectric-semiconductor interface and into the base region. This minority carrier injection is attributed to a direct tunneling mechanism.

30 Claims, 4 Drawing Figures

NOVEL BIPOLAR TRANSISTOR WITH A DUAL-DIELECTRIC TUNNEL EMITTER

BACKGROUND OF THE INVENTION

Field of the Invention

The present invention relates to bipolar transistors, in general, and more particularly, to a dual-dielectric emitter bipolar transistor utilizing direct tunneling of minority carriers as the primary mechanism of operation.

Prior Art Discussion

Basically, there exists, for the most part, two types of fabricated transistor structures, namely bipolar and field effect transistors. The fabrication of the bipolar transistor entails two diffusion or equivalent steps for incorporating the base and emitter regions into the collector region. The first step usually diffuses the base region into the collector region and the second step diffuses the emitter region into the already diffused base region. This second step is generally very sensitive and not well controlled especially when a uniform, narrow base width region is required, for example in microwave applications at frequencies in the GHz range. The more recently developed insulated gate field effect transistors (IGFET) require only one diffusion or equivalent step for fabrication thereof. A second process step is performed by the deposition of insulation layers in a selected region of the semiconductor surface and a metal gate contact is deposited on top of the insulation layers. The deposition steps are considered usually a well-controlled process which overcomes the problems associated with the sensitive diffusion step of the bipolar fabrication. However, the operational response times characteristic of IGFET's appear not to be as good as bipolar transistors for microwave applications.

Contrasting the operation of the two devices, the bipolar transistor is operative to inject minority carriers across the emitter-base junction into the base region when an appropriate forward bias voltage potential is applied across the emitter-base junction. The base region is usually lightly doped to allow for a good ratio of current injected into the base to current injected from the base into the emitter. A large percentage of these minority carriers transport across the base without recombination and cross the collector-base junction due to the energy from a reverse bias voltage potential applied across the base-collector junction. On the other hand, the IGFET's, such as metal-oxide-semiconductors (MOS) or metal-nitride-oxide-semiconductors (MNOS) do not inject carriers across the gate-insulator-semiconductor interface, but rather develop a space charge region on the surface of the semiconductor at the insulator-semiconductor interface. When an electric field is developed across the insulator(s) is of a correct polarity and sufficient magnitude, an inversion layer is produced in a channel between the source and drain regions of the device which enables the source to inject carriers through this space charge inversion layer channel to a drain which is biased in relation to the source to collect the injected carriers.

The fabrication process of the IGFET's is considered to be better controlled, requires one less diffusion step, and the gates or cells are self-isolating from other cells fabricated on same substrate. For these reasons, it has been generally chosen as the main cell structure used in most medium-scale (CMSI) and large-scale integration (LSI) circuits-on-a-chip. However, these IGFET's do have limitations involving response times and current drive capacity. Generally bipolar devices are used when high frequency response is required, such as for microwave applications for example, or when it is required to supply high output drive currents over relatively short time periods as in some microcomputer and high speed memory applications, and for these reasons attempts are sometimes made to fabricate both bipolar and IGFET's on the same substrate. This process becomes lengthy and complicated due to the second diffusion process step and cell structure isolation which are usually required for the fabrication of the bipolar devices. In addition a high quality gate oxide must be provided for the MOS transistors, in most cases. A desirable alternative is to have a transistor device having bipolar characteristics, yet being compatible with the IGFET fabrication process.

Recently, investigative research has been conducted on thin-oxide MNOS memory transistor for application in non-volatile charge storage memory devices wherein charge is stored in deep traps at or near the nitride-oxide interface. Charge transport in these devices takes place across the semiconductor-insulator interface. Several conduction mechanisms have been employed to explain this charge transport. In one analysis, with an oxide thickness in the range of 50–200Å, the current transport was considered to be of Fowler-Nordhiem tunneling (indirect tunneling) in the oxide layer and Poole-Frenkel conduction in the nitride. In another examination of an MNOS structure having oxide thicknesses in the range of 15–35Å, the current transport mechanism in the oxide was considered direct tunneling from deep traps in the insulator-insulator interface to the silicon energy conduction band. Reference is made to a paper published in the IEEE Transactions on Electron Devices, Vol. ED-19, No. 12 dated December, 1972 entitled "Characteristics of Thin-Oxide MNOS Memory Transistors" by White and Cricchi and also to a U.S. Patent No. 3,577,210; entitled "Solid State Storage Devices" by Hans G. Dill; patented May 4, 1971 for a more detailed understanding of the aforementioned insulator-semiconductor carrier injection mechanisms.

In the past, attempts have been made to utilize insulator-semiconductor junctions in transistor applications. Examples are found in the U.S. Pat. No. 3,060,327 issued to Dacey; patented Oct. 23, 1962 and the U.S. Patent No. 3,462,700 issued to Berglund et al; patented Aug. 19, 1969. The Dacey patent employs a p-n-p transistor structure wherein the p-n emitter-base junction is avalanched in response to a reverse bias voltage potential applied thereacross such that majority carriers are avalanched across the barrier of the junction into the n-type base region. In one embodiment of the Dacey invention, a dielectric insulator is fabricated adjacent to the n-type base region to form an n-p base-collector junction and when positively biased in relation to the base potential, the insulator region is used to collect the majority carriers through the emitter-base junction. Dacey's invention appears to operate as a hot electron carrier device wherein the majority carriers suffer many collisions in their transit through the n-type base to the insulation layer. For this reason, the base region must be fabricated very thin and dielectric must also be very thin in order for the majority carriers to maintain enough energy to overcome the potential barrier at the base collector junction. Devices employing the avalanche mechanism are known to generally exhibit electrical noise problems in their operation.

The Berglund et al patent appears to operate on the principle of a field effect device. In one embodiment of the Berglund et al invention, a p-type heavily doped (degenerate level doping) material is sandwiched between a dielectric film on an n-type bulk silicon material. Metal electrodes are adhered to each layer such to affect biasing across each of the two junctions — insulator/p-type and p-type/n-type. The creation of minority carriers is affected within the p-type silicon material at the insulator surface caused principally by the bending of the energy bands according to the bias voltage potential applied across the insulator. A sufficient enough electric field applied across the insulator will produce an avalanche mechanism to occur in the p-type silicon such that carriers tunnel from the conduction band to the valence band of the heavily doped p-type material. It appears that no carriers are injected across the insulator-semiconductor junction with this operation. It further appears that Berglund's invention is limited in that it requires the use of a degenerately doped p-type base which is slightly more difficult to produce and further, since it employs the avalanche mechanism, it may also be electrically noisy in operation as devices employing avalanche mechanisms generally are.

It is evident from the above discussion that a transistor device having bipolar characteristics which are functionally well suited for high frequency application, say in the GHz range, and having a compatible fabrication technology with the MOS, MNOS and CMOS transistor structures would be of paramount importance to the solid-state industry. In addition, the elimination of the second processing step for fabricating bipolar transistors could accordingly bring about a reduction in required process control possibly rendering a savings in production cost and time. An improved control of transistor base width construction could yield high frequency response characteristics without special fabrication techniques over that which is presently available.

SUMMARY OF THE INVENTION

In accordance with the present invention, a dual-dielectric tunnel emitter transistor device is comprised of a collector region of semiconductor material, doped with a p-type (n-type) doping impurity, and a base region of semiconductor material, doped with an n-type (p-type) doping impurity, disposed adjacent to the collector region and in physical contact therewith to form a n-p (p-n), base-collector semiconductor junction. Additionally, a first layer of dielectric material of a predetermined thickness has one surface disposed adjacent to and in physical contact with the base region to form a dielectric-semiconductor interface. A second layer of dielectric material of a predetermined thickness has one surface disposed adjacent to and in physical contact with the other surface of the first dielectric layer wherein the first dielectric layer is sandwiched between the base region and the second dielectric layer to form a dual-dielectric, emitter-base junction. Means are provided for applying a voltage potential which allows conduction across the dual-dielectric, emitter-base junction to cause injection of minority carriers across the dielectric-semiconductor interface and into the base region. This minority carrier injection occurs as a result of a direct tunneling mechanism across the dielectric-semiconductor interface which is governed by a positive (negative) potential of sufficient magnitude applied to the other dielectric surface of the second layer with respect to the n-type (p-type) doped base region. Means are also provided for applying a potential across the n-p (p-n) base-collector junction to transport the injected minority carriers across the base-collector junction. This minority carrier transport mechanism occurs when a negative (positive) potential of sufficient magnitude is applied to the p-type (n-type) collector region with respect to the n-type (p-type) base region.

More specifically, the dielectric material of the first layer may be silicon dioxide and the thickness of the silicon dioxide is preferably less than 30Å to promote the direct tunneling mechanism for injecting minority carriers across the dual-dielectric, emitter-semiconductor base junction. Accordingly, the material of the second layer is preferably a compound of silicon and nitrogen having substantially equal proportions of each and wherein the thickness of the silicon-nitrogen compound may have a range of 50-500Å.

DESCRIPTION OF THE PREFERRED EMBODIMENT

Figure 1:
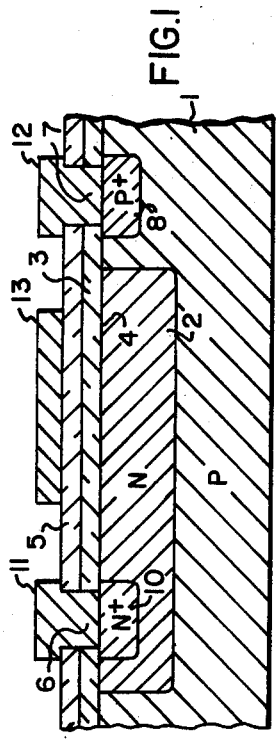
FIG. 1 is a cross-sectional diagram of the structure of a dual-dielectric, emitter bipolar transistor embodiment of the present invention.

A cross-sectional diagram of the structure for a bipolar p-n-p type dual-dielectric emitter transistor device is presented in FIG. 1. A collector region 1 of semiconductor material is doped with a p-type impurity. The semiconductor material generally used is silicon and the p-type doping material may be the element boron or any equivalent element which allows for an excess of mobile holes in the silicon semiconductor material. A portion 2 of the p-type collector region 1 is doped with an n-type impurity such as phosphorus or any equivalent which allows for an excess of mobile electrons therein. This doping process may be performed using a diffusion or ion implantation technique, both well-known methods in the pertinent art. This portion 2 may be considered the base region of the p-n-p type transistor device. It is generally well known in the semiconductor art that the holes represent the majority carriers in the p-type doped region and the electrons represent the majority carriers in the n-type doped region. Consequently, holes in the n-type doped region and electrons in the p-type doped regions may be considered minority carriers.

The transistor structure of FIG. 1 further includes a first layer 3 of dielectric material generally silicon dioxide or aluminum oxide which may be chemically grown or thermally grown on the surface of the n-type and p-type regions to form a dielectric semiconductor interface 4 particularly with the base region 2. A second layer 5 of dielectric material is fabricated over the first layer 3 normally by chemical vapor deposition techniques more commonly referred to as spittering. Usually ammonia and silane at proportions of 200:1 are used for deposition at temperatures in the range of 450°-750° C. to form a silicon-nitrogen compound such as $Si_3N_4$ or SiN dependent on the desired ratio of silicon to nitrogen. For the purposes of this embodiment, it is preferred that the proportions of silicon and nitrogen be substantially equal so that the silicon-nitrogen compound may be more conductive Accordingly, the thickness of the grown silicon dioxide layer 3 is on the order of 20Å (angstroms) and preferably is held to limits within approximately 30Å for the purposes of this embodiment. The thickness of the silicon nitride layer 5 on the other hand may range from 50 to 500Å dependent of the process used and the planned application.

Windows 6 and 7 are etched in the dielectric layers 3 and 5 by a well-known photolithographic process to provide surface areas on the base and collector regions 2 and 1, respectively. An ohmic contact region 8 may be fabricated into the p-type collector region below the window opening 6 by heavily diffusion doping with a high concentration of a p-type impurity such as phosphorus. And, an ohmic contact region 10 may be fabricated into the n-type base region below the window opening 7 by heavily diffusion doping with a high cocentration of a p-type impurity such as boron. A metal, typically aluminum, may then be deposited by evaporation, for example, into the window 6 over the ohmic contact region 10 to form a base contact 11 and into window 7 over the ohmic contact region 8 to form a collector contact 12. Another portion 13 of metal, typically aluminum, may be deposited by evaporation, for example, in contact with the dielectric layer 5 directly over a substantial portion of the base region 2. Gold may also be used for metal contacts 11, 12 and 13. The dual-dielectric layers 5 and 3 which are sandwiched between the metal portion 13 and the base region 2 may be considered as the emitter of the transistor device of the embodiment depicted in FIG. 1. The interface 4 may therefore be referred to as the emitter-base junction and the metal portion 13 may be considered as the emitter contact.

It is understood that the cross-sectioned structure as depicted in FIG. 1 is only typical of a planar transistor construction and is shown here in its simplest form for purposes of describing an embodiment of the invention. It can be appreciated by those well skilled in the pertinent art that other transistor construction architectures may be considered, such as a lateral transistor construction, without deviating from the broad scope of the invention as presented herein. It is further understood that while the embodiment presented is described in connection with a p-n-p type transistor arrangement, a n-p-n type arrangement may also have been used therefor and either arrangement may be considered as the preferred embodiment. Still further, while the description of the structure of FIG. 1 has been presented in connection with a variety of fabrication process steps, it is understood that the sequence in which the process steps have been presented should in no way be construed as the necessary order in which the transistor device is to be constructed. There may be steps which may be interchanged for convenience, economic justification or whatever.

Figure 2:
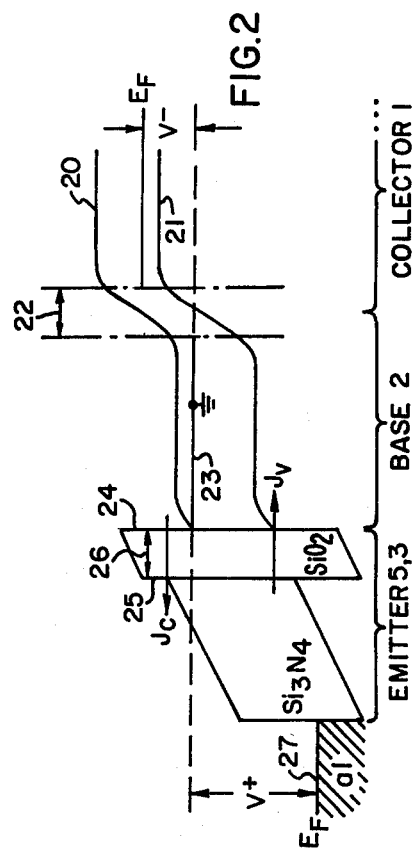
FIG. 2 is an energy band diagram illustrating the operation of the transistor embodiment of FIG. 1.

The operation of the p-n-p type dual-dielectric transistor device of FIG. 1 may best be described in connection with an energy band diagram as shown in FIG. 2 which is illustrative of a transistor device operating in the common base mode. The lines 20 and 21 are respectively representative of the limits of the conduction and valence energy bands for the base and collector semiconductor regions, 2 and 1, respectively, and a base-collector junction 22 formed therebetween. The conduction and valence energy bands are graphed with respect to the extrinsic Fermi level potential of the base region which is at zero potential for the common base mode operation. The extrinsic Fermi level for the base region is shown as a solid line 23 in the base region and continues as a dotted line 23 into the emitter and collector regions. It is apparent from FIG. 2 that there exists a discontinuity in the conduction and valence bands at the semiconductor-dielectric interface 24. This discontinuity is representative of a potential barrier which generally exists between the semiconductor and dielectric materials. It should also be made clear that the depiction in FIG. 2 is for illustration purposes and should not be construed in relation to magnitudes for quantitative measurements. Another discontinuity 25 in conduction and valence bands exists at the interface of the two dielectric layers 5 and 3 comprising the emitter portion of the transistor device.

In order to effect the desired operation of the transistor device of FIG. 1, it is required that a positive conduction potential $V^+$ be applied to the emitter contact with respect to the base contact 11. In effect then, a voltage potential exists across the dual-dielectric emitter region. The Fermi level 27 of the metal contact 13 and the surface of the surface of the second dielectric layer 5 in physical contact therewith is shown in relation to the extrinsic Fermi level 23 of the base region 2. This voltage potential $V^+$ across the dielectric layers 5 and 3 causes a bending of the energy bands 20 and 21 in the base region at the surface of the silicon-silicon dioxide, emitter-base junction 24. The energy bands 20 and 21 are bent to such an extent at this surface area to be considered in what may be referred to as an accumulation state. The energy bands of the silicon dioxide layer 3 will exhibit a voltage drop as shown by the linear slope of the bands in the silicon dioxide region and the energy bands of the silicon-nitride layer 5 will exhibit similar effects of energy band bending.

The present theory of operation of MNOS memory devices, which has been discussed briefly in the Background section, predicts that there can be two mechanisms through which charge may be tunneled from the $Si_3N_4$-$SiO_2$ interface 25 as shown in FIG. 2 into the silicon semiconductor base region. Dominance of one mechanism over the other is generally considered dependent on the thickness of the first dielectric layer 3 more commonly referred to, in the context of an energy band diagram, as a tunnel barrier shown as dimension 26 in FIG. 2. The first of the two mechanisms is referred to as Fowler-Nordhiem tunneling and is considered the more probable mechanism for a $SiO_2$ tunnel barrier substantially greater than 30Å. While for tunnel barrier thickness substantially less than 30Å, the second mechanism, known as direct tunneling is considered more probable.

Referring to FIG. 2, Fowler-Nordhiem tunneling for a p-n-p type transistor, in theory, consists of tunneling of base region majority carriers (electrons for n-type semiconductor material) from the conduction energy band of the base region, through the forbidden gap region of the $SiO_2$ first dielectric layer 3 to the conduction band of the silicon-nitride second dielectric layer 5. This majority carrier flow is denoted as $J_c$ in FIG. 2. In contrast, direct tunneling consists of tunneling of electrons from the valence energy band of the n-type base region, where theoretically it is improbable for mobile electrons to exist, to accept or trap states in the silicon-nitride forbidden gap region at the interface 25. Since the electrons of the valence energy bands of the n-type base region are not in excess, the direct tunneling mechanism results, theoretically, in the creation of a hole in the valence energy band of the base region 3 in place of each electron tunneled through the SiO$_2$ tunnel barrier 26 to the silicon-nitride dielectric layer 5. Therefore, it may be analogously considered that holes are being injected into the valence band of the base region as a result of the direct tunneling mechanism as described hereabove. Consequently, it is entirely proper to refer to a minority carrier current injection across the dual-dielectric, emitter-base junction and into the valence energy band of the base region and such a current is denoted as J$_v$ in FIG. 2. This current J$_v$, of course, is equal and opposite in direction to the flow of electrons as a result of the direct tunneling mechanism.

The magnitude of the positive voltage potential V$^+$ for operation is dependent on many variables, such as SiO$_2$ thickness, proportion of silicon in the silicon-nitride compound of the dielectric material, the concentration of n-type dopant impurities in the base region, the type of metal used for the emitter and base contacts, the amount of gold, copper or equivalent metal impurities in the n-type doped base region, and the amount of imperfection in the lattice structure of the silicon-nitride dielectric, to name just a few. In one set of experimental results shown hereinbelow, a positive voltage potential V$^+$ ranging from 20 to 30 volts provided adequate operational results.

Still referring to FIG. 2, a sufficient negative voltage potential V$^-$ may be applied to the collector region 1 using contact 12 (see FIG. 1) as is standardly done for most p-n-p transistor applications. The high electric fields which exist as a result of the sufficiently reverse biased base-collector semiconductor junction 22 causes the injected minority carrier to be transported through the base region 2 and across the junction 22 into the collector 1. Thus, from the description above it appears that the operation of a conventional bipolar p-n-p transistor device may be emulated by replacing the semiconductor emitter portion of a conventional bipolar transistor with dual-dielectric layers.

While the embodiment of FIG. 1 has been described in connection with a p-n-p type transistor device, it is clear to anyone of average skill in the pertinent art that a similar description could just as well have been presented using an n-p-n type transistor device. In such a case, the collector region 1 would be doped with n-type dopant impurities and the base region 2 would be doped with p-type impurities and the ohmic contacts 8 and 10 would be doped accordingly. Further, the conduction potential of the emitter must be applied negatively with respect to the base and consequently, the potential applied to the collector region must be positive with respect to the base region, thereby maintaining a reverse bias polarity across the base-collector junction. In contrast to FIG. 2, the energy bands 20 and 21 of an n-p-n device will bend upward at the surface 24 to an extent which permits direct tunneling of electrons to occur between the silicon-nitride dielectric and the p-type doped semiconductor base region 2 across the tunnel barrier width 26. Electrons are considered as the minority carriers in the p-type doped base region 2, and are transported through the p-type base region 2 and across the base-collector junction.

A common emitter current gain, $\beta$, for a case in which few minority carriers recombine in the base region (i.e., the minority carriers are mostly transported across the base-collector junction) may be essentially determined by the ratios of the currents denoted as J$_v$ and J$_c$ described in connection with FIG. 2. This ratio is shown below in equation (1):

$$\beta \simeq \frac{J_v \text{ (Direct Tunneling)}}{J_c \text{ (Fowler-Nordhiem Tunneling)}} \quad (1)$$

Current J$_v$ and J$_c$ may be represented as:

$$J_v = C_1 \exp(E/\alpha_1) \quad (2)$$

and $$J_c = C_2 E^2 \exp(-\alpha_2/E) \quad (3)$$

where C$_1$, C$_2$, $\alpha_1$, and $\alpha_2$ are tunneling constants and E is the electric field across the tunnel oxide. Therefore, by substituting equations (2) and (3) in quation (1), the common emitter current gain may be expressed by equation (4) below:

$$\beta \simeq \frac{C_1}{C_2 E^2} \exp\left(\frac{E}{\alpha_1} + \frac{\alpha 2}{E}\right) \quad (4)$$

Figure 3:
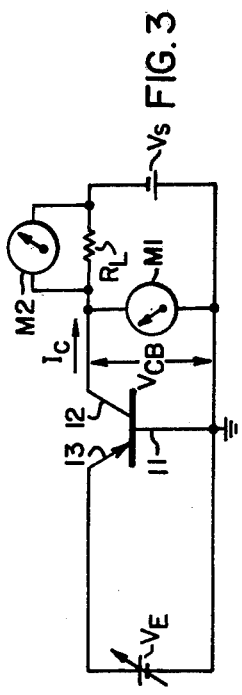
FIG. 3 is a circuit schematic of a p-n-p transistor device similar to the embodiment of FIG. 1 under an experimental test condition.

It is apparent from equation (4) that theoretically at low electric fields, E, the current gain should be large. However, one may also conclude qualitatively, without referring to the explicit values of the tunneling constants, that $\beta$ will be large even for large electric fields, E, since direct tunneling is the dominant current injection mechanism for SiO$_2$ dielectric thickness substantially less than 30Å. Also, observed from equation (1), the current gain, $\beta$, is not an explicit function of the base doping as it appears to be for the semiconductor emitter type bipolar transistor. Consequently, a high base region doping concentration may be used without degrading the current gain, $\beta$. A p-n-p type bipolar device having a dual-dielectric emitter similar to that described in connection with FIG. 1 has been experimentally tested using a circuit similar to that schematically shown in FIG. 3. This circuit is also typical of an arrangement of the bipolar device for driving a load. The p-n-p type transistor is conventionally symbolized as having an emitter contact 13, a base contact 11 and a collector contact 12 wherein a variable voltage potential generator V$_E$ is connected in series with the emitter 13 and ground potential, the base 11 is connected directly to ground potential and the collector 12 is connected in series with a load resistor R$_L$ representative of an impedance loading, a predetermined source voltage potential generator V$_S$ and ground potential. A positive potential V$_E$ is applied to the emitter 13 with respect to the base 11 which is at ground potential. A negative potential V$_S$ is applied to the resistor R$_L$ with respect to ground rendering the collector 12 negatively biased with respect to the base. A meter M1 is connected across the collector 12 and base contacts to measure the resulting voltage appearing thereacross and another meter M2 is connected across the resistor R$_L$ to measure the current I$_c$ flowing through the resistor R$_L$ from the collector contact 12.

Figure 4:
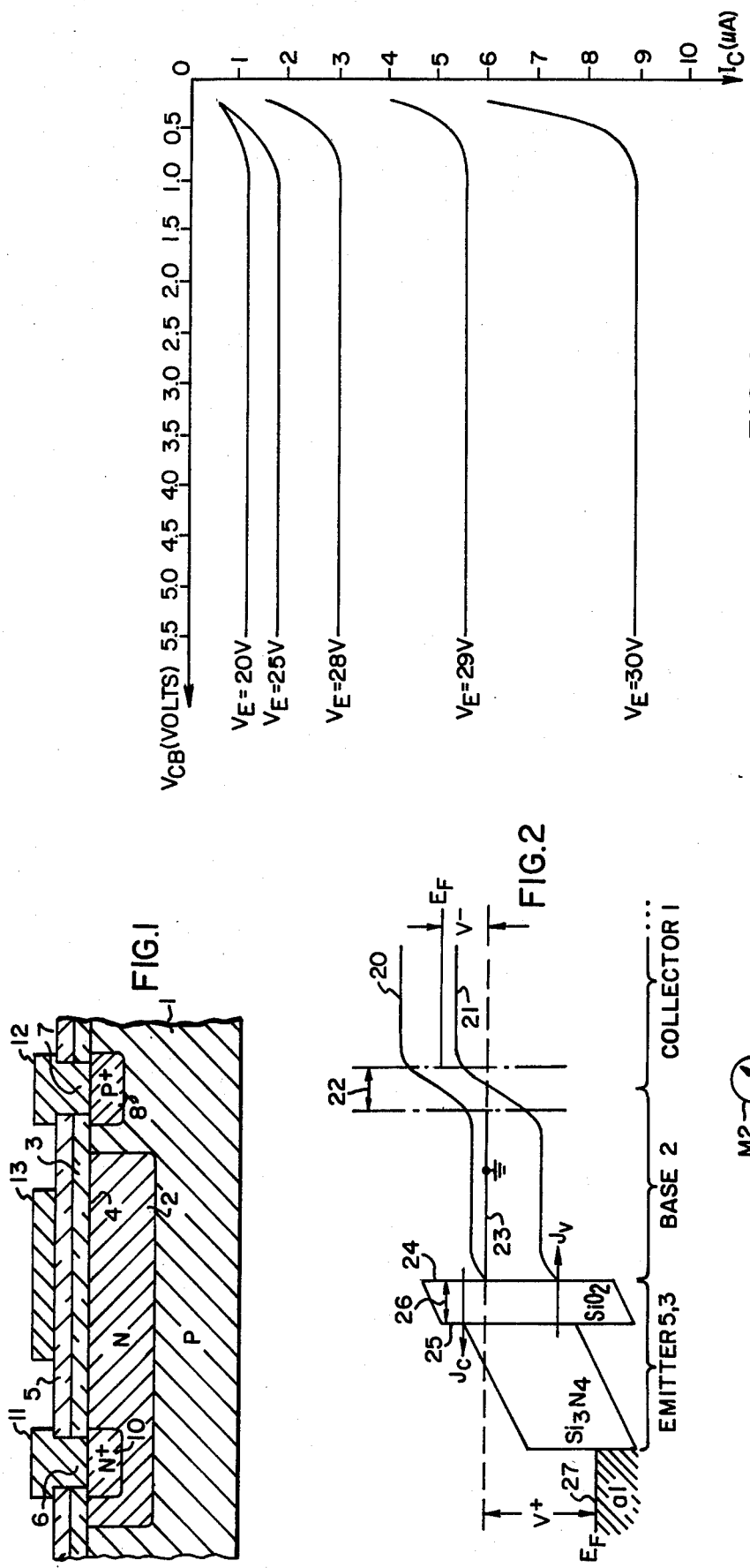
FIG. 4 is a graph of a family of curves which are representative of experimental operational results of the invention.

One of the tests which were experimentally conducted was to set the voltage potential V$_E$ at a number of suitable levels. At each level, the voltage potential V$_{CB}$ and collector current I$_c$ were measured using meters M1 and M2, respectively. A family of curves resulting from one such experimental test is presented in FIG. 4 to exemplify the operation of a typical dual-dielectric transistor device. It may be concluded that the family of curves experimentally achieved are similar to a family of curves one might expect from a conventional p-n-p transistor device except that the dual-dielectric transistor device appears to be voltage controlled as compared with a conventional transistor device which is controlled generally by its base current.

While the example described above was provided in connection with a common base transistor circuit configuration, it should not be constructed that this is the only circuit configuration possible. It is understood by those skilled in the pertinent art area that the dual-dielectric transistor device may be utilized in any of the conventional transistor configurations, such as the common emitter or common collector configurations, without deviating from the broad principles of the invention. Further, the above example, while described using a p-n-p type transistor arrangement, may have just as well have been presented using a n-p-n type transistor arrangement, comprised of a dual-dielectric, emitter-base junction as previously described hereinabove, without deviating from the scope of the invention as defined by the claims at the end of the application.

Some principal advantages of a dual-dielectric transistor structure, similar to the one depicted in FIG. 1, which appear to lie in the areas of high frequency transistor operation and compatibleness with the MNOS, MOS and CCD solid-state fabrication technologies are as follows:

(1) There is a possibility of achieving practically no base-emitter region neutral capacitance. It is well known that the neutral capacitance of a diffused emitter bipolar transistor structure arises from the storage of mobile charge within the emitter-base space charge region. Therefore, the neutral capacitance increases exponentially with base-emitter voltage and is understood to be the main limitation at current densities encountered in microwave transistor operation (i.e., $10^3$ amp/cm$^2$). In contrast, the surface of the dual-dielectric tunnel emitter transistor device is in an accumultion state due to the polarity of the voltage potential applied across the emitter-base junction and for this reason, no space charge region exists and thereby substantially no neutral capacitance is expected;

(2) The ability to use a high base impurity doping concentration yields a reduced base resistance $r_{bb}$ parameter and a reduced base conductivity modulation wherein one may be able to inject a greater concentration of minority carriers into the base region before exceeding the base region majority carrier concentration.

In addition, the high base impurity doping concentration may reduce base widening which is commonly referred to as the Kirk effect. It is basically understood by those skilled in the pertinent art that, in general, a high base impurity concentration with a shallow base diffusion will create what is known as a high impurity gradient which may eventually lead to high drift electric fields. Therefore, a higher minority carrier injection concentration from the emitter region to the base region can be sustained before the effective base width may be increased. Another possible advantage of the high doping is that the temperature compensation of the base dopant may be reduced;

(3) No substantial emitter dip effect is expected in the structure of the dual-dielectric transistor device;

(4) Better control of base width and concentration is anticipated because a very shallow base diffusion or ion implantation may be used. In addition, it appears that it is not essential to control a double diffusion to establish a base width as is presently required in fabrication of most bipolar transistor devices;

(5) Smaller emitter area may be achieved since there appears to be no lateral diffusion of dopant impurities as is normally encountered with the emitter diffusion of conventional bipolar transistor devices; and (6) High input impedance when operating in the known common emitter mode is expected.

I claim:

1. A transistor device having a dual-dielectric tunnel emitter, comprising:

a collector region of semiconductor material doped with a p-type doping impurity;

a base region of semiconductor material doped with a n-type doping impurity and disposed adjacent to and in physical contact with the collector region to form a n-p, base-collector junction;

a first layer of dielectric material of a predetermined thickness having one surface disposed adjacent to and in physical contact with said base region to form a dielectric-semiconductor interface;

a second layer of dielectric material of a predetermined thickness having one surface disposed adjacent to and in physical contact with the other surface of said first dielectric layer, said first dielectric layer being sandwiched between said base region and said second dielectric layer to form a dual-dielectric emitter-base junction;

means for applying a voltage potential between the other surface of said second dielectric layer and said base region to cause injection of minority carriers across the dielectric-semiconductor interface and into the base region, said minority carrier injection occurring at times when a positive potential of sufficient magnitude is applied to said other dielectric surface of the second layer with respect to said n-type doped base region; and means for applying a voltage potential across the n-p, base-collector junction to transport said injected minority carriers across said n-p, base-collector junction, said base minority carrier transport mechanism occurring when a negative potential of sufficient magnitude is applied to said collector region with respect to said base region.

2. A transistor device according to claim 1 wherein said first layer is of a thickness to promote a direct tunneling mechanism for injecting minority carriers across the dielectric-semiconductor interface when a positive potential of sufficient magnitude is applied thereacross.

3. A transistor device according to claim 1 wherein the dielectric material of the first layer is silicon dioxide.

4. A transistor device according to claim 3 wherein the thickness of the silicon dioxide first layer is less than approximately 30Å.

5. A transistor device according to claim 1 wherein the dielectric material of the second layer is a compound comprising the elements of silicon and nitrogen.

6. A transistor device according to claim 5 wherein the elements of silicon and nitrogen are substantially equal in proportion.

7. A transistor device according to claim 5 wherein a range of thickness dimensions for the second layer is 50–500Å.

8. A transistor device having a dual-dielectric tunnel emitter, comprising:
   a collector region of semiconductor material doped with a n-type doping impurity;
   a base region of semiconductor material doped with a p-type doping impurity and disposed adjacent to and in physical contact with the collector region to form a p-n, base-collector junction;
   a first layer of dielectric material of a predetermined thickness having one surface disposed adjacent to and in physical contact with said base region to form a dielectric-semiconductor interface;
   a second layer of dielectric material of a predetermined thickness having one surface disposed adjacent to and in physical contact with the other surface of said first dielectric layer, said first dielectric layer being sandwiched between said base region and said second dielectric layer to form a dual-dielectric emitter-base junction;
   means for applying a voltage potential between the other surface of said second dielectric layer and said base region to cause injection of minority carriers across the dielectric-semiconductor interface and into the base region, said minority carrier injection occuring at times when a nagative potential of sufficient magnitude is applied to the other dielectric surface of said second layer with respect to said p-type doped base region; and
   means for applying a potential across the p-n, base-collector junction to transport said injected minority carriers across said p-n, base-collector junction, said base minority carrier transport mechanism occurring when a positive potential of sufficient magnitude is applied to said collector region with respect to said base region.

9. A transistor device according to claim 8 wherein the first layer is of a thickness to promote a direct tunneling mechanism for injecting minority carriers across the dielectric-semiconductor interface when a negative potential of sufficient magnitude is applied thereacross.

10. A transistor device according to claim 8 wherein the dielectric material of the first layer is silicon-dioxide.

11. A transistor device according to claim 10 wherein the thickness of the silicon dioxide first layer is less than approximately 30Å.

12. A transistor device according to claim 8 wherein the dielectric material of the second layer is a compound comprising the elements of silicon and nitrogen.

13. A transistor device according to claim 12 wherein the elements of silicon and nitrogen are substantially equal in proportion.

14. A transistor device according to claim 12 wherein a range of thickness dimensions for the second layer is 50–500Å.

15. A transistor circuit for supplying current to a load of predetermined impedance, said circuit comprising:
   a collector region of semiconductor material doped with a p-type doping impurity;
   a base region of semiconductor material doped with a n-type doping impurity and disposed adjacent to and in physical contact with the collector region to form a n-p, base-collector junction;
   a first layer of dielectric material of a predetermined thickness having one surface disposed adjacent to and in physical contact with said base region to form a dielectric-semiconductor interface;
   a second layer of dielectric material of a predetermined thickness having one surface disposed adjacent to and in physical contact with the other surface of said first dielectric layer, said first dielectric layer being sandwiched between said base region and said second dielectric layer to form a dual-dielectric emitter-base junction;
   a first means for applying a voltage potential to the other surface of said second dielectric layer;
   a second means for applying a voltage potential to said base region;
   a third means for connecting said collector region to said load of predetermined impedance to allow current therebetween;
   a first source of voltage potential connected to said first means;
   a second source of voltage potential connected to said second means, said second source having a voltage potential sufficiently negative with respect to said first source such that injection of minority carriers is caused to occur across the dielectric-semiconductor interface and into the base region; and
   a third source of voltage potential connected to said load of predetermined impedance, said third source having a voltage potential sufficiently negative with respect to said second source to cause a substantial portion of said injected minority carriers to flow across said base-collector junction into said collector region and therefrom through said load, the amount of said minority carrier flow being governed by the voltage differential between said first and second sources.

16. A transistor circuit according to claim 15 wherein the first layer is of a thickness to promote a direct tunneling mechanism for injecting minority carriers across the dielectric-semiconductor interface when a positive potential of sufficient magnitude being affected by the difference in voltage potentials of the first and second sources is applied thereacross.

17. A transistor circuit according to claim 15 wherein the dielectric material of the first layer is silicon dioxide.

18. A transistor circuit according to claim 17 wherein the thickness of the silicon dioxide first layer is less than approximately 30Å.

19. A transistor circuit according to claim 15 wherein the dielectric material of the first layer is aluminum oxide.

20. A transistor circuit according to claim 15 wherein the dielectric material of the second layer is a compound comprising the elements of silicon and nitrogen.

21. A transistor circuit according to claim 20 wherein the elements of silicon and nitrogen are substantially equal in proportion.

22. A transistor circuit according to claim 20 wherein a range of thickness dimensions for the second layer is 50–500Å.

23. A transistor circuit for supplying current to a load of predetermined impedance, said circuit comprising:
   a collector region of semiconductor material doped with a n-type doping impurity;
   a base region of semiconductor material doped with a p-type doping impurity and disposed adjacent to and in physical contact with the collector region to form a p-n, base-collector junction;
   a first layer of dielectric material of a predetermined thickness having one surface disposed adjacent to and in physical contact with said base region to form a dielectric-semiconductor interface;

a second layer of dielectric material of a predetermined thickness having one surface disposed adjacent to and in physical contact with the other surface of said first dielectric layer, said first dielectric layer being sandwiched between said base region and said second dielectric layer to form a dual-dielectric emitter-base junction;

a first means for applying a voltage potential to the other surface of said second dielectric layer;

a second means for applying a voltage potential to said base region;

a third means for connecting said collector region to said load of predetermined impedance to allow current therebetween;

a first source of voltage potential connected to said first means;

a second source of voltage potential connected to said second means, said second source having a voltage potential sufficiently positive with respect to said first source such that injection of minority carriers is caused to occur across the dielectric-semiconductor interface and into the base region; and a third source of voltage potential connected to said load of predetermined impedance, said third source having a voltage potential sufficiently positive with respect to said second source to cause a substantial portion of said injected minority carriers to flow across said base-collector junction into said collector region and therefrom through said load, the amount of said load current being governed by the voltage differential between said first and second sources.

24. A transistor circuit according to claim 23 wherein the first layer is of a thickness to promote a direct tunneling mechanism for injecting minority carriers across the dielectric-semiconductor interface when a negative potential of sufficient magnitude being affected by the difference in voltage potentials of the first and second sources is applied thereacross.

25. A transistor circuit according to claim 23 wherein the dielectric material of the first layer is silicon-dioxide.

26. A transistor circuit according to claim 23 wherein the dielectric material of the first layer is aluminum oxide.

27. A transistor circuit according to claim 10 wherein the thickness of the silicon dioxide first layer is less than approximately 30Å.

28. A transistor circuit according to claim 8 wherein the dielectric material of the second layer is a compound comprising the elements of silicon and nitrogen.

29. A transistor circuit according to claim 12 wherein the elements of silicon and nitrogen are substantially equal in proportion.

30. A transistor circuit according to claim 12 wherein a range of thickness dimensions for the second layer is 50–500Å.

* * * * *